(12) United States Patent
Harper, Jr.

(10) Patent No.: US 6,830,462 B1
(45) Date of Patent: Dec. 14, 2004

(54) ELECTRICAL CONNECTOR HOUSING

(75) Inventor: Donald K. Harper, Jr., Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/460,007

(22) Filed: Dec. 13, 1999

(51) Int. Cl.[7] .............................................. H01R 12/00
(52) U.S. Cl. ........................ 439/71; 439/83; 439/330; 439/457; 439/525; 439/476.1
(58) Field of Search ............................. 439/70–71, 83, 439/525–526, 457, 330, 76.1, 683, 476.1, 72

(56) References Cited

U.S. PATENT DOCUMENTS

| | | | |
|---|---|---|---|
| 5,369,551 A | * 11/1994 | Gore et al. ............... | 361/767 |
| 5,467,253 A | 11/1995 | Heckman et al. .......... | 361/761 |
| 5,474,458 A | 12/1995 | Vafi et al. ................. | 439/91 |
| 5,490,040 A | 2/1996 | Gaudenzi et al. .......... | 361/773 |
| 5,525,834 A | 6/1996 | Fischer et al. ............. | 257/691 |
| 5,572,405 A | 11/1996 | Wilson et al. ............. | 361/705 |
| 5,701,032 A | 12/1997 | Fischer et al. ............. | 257/692 |
| 5,751,556 A | 5/1998 | Butler et al. .............. | 361/773 |
| 5,777,379 A | 7/1998 | Karavakis et al. ......... | 257/668 |
| 5,777,387 A | 7/1998 | Yamashita et al. ......... | 257/737 |
| 5,786,631 A | 7/1998 | Fishley et al. ............. | 257/701 |
| 5,788,510 A | * 8/1998 | Walker ....................... | 439/61 |
| 5,823,801 A | * 10/1998 | Elkhatib ..................... | 439/83 |
| 5,876,219 A | * 3/1999 | Taylor et al. ............... | 439/74 |
| 6,033,236 A | * 3/2000 | McHugh et al. ........... | 439/74 |
| 6,527,597 B1 | * 3/2003 | Harper, Jr. .................. | 439/701 |

FOREIGN PATENT DOCUMENTS

WO    WO 98/15989    4/1998

* cited by examiner

Primary Examiner—Truc T. T. Nguyen
(74) Attorney, Agent, or Firm—Woodcock Washburn LLP

(57) ABSTRACT

A connector is provided for reducing the effects of differential coefficient of thermal expansion of the connector and the underlying circuit board. The connector exhibits high coplanarity along the mounting interface by providing an insulative connector housing in which stress buildup is avoided. The connector housing incorporates compliant sections corresponding to the areas where the greatest deformation in the substrate is expected. The housing has notches or slots at locations furthest from the neutral point (NP) of the connector (i.e., around the corners). By means of this arrangement, stress buildup is avoided, so as to minimize warping and twisting of the housing.

10 Claims, 4 Drawing Sheets

ELECTRICAL CONNECTOR HOUSING

FIELD OF THE INVENTION

The present invention relates in general to an electrical connector and, more particularly, to a ball grid array (BGA) connector having a housing that can accommodate thermal cycling and circuit substrate or circuit board deformation or warpage characteristics.

BACKGROUND OF THE INVENTION

The drive to reduce the size of electronic equipment, particularly personal portable devices, and to add additional functions to such equipment, has resulted in an ongoing drive for miniaturization of all components, especially electrical connectors. Efforts to miniaturize connectors have included reducing the pitch between terminals in single or double row linear connectors, so that a relatively high number of I/O or other lines can be interconnected by connectors that fit within tightly circumscribed areas on the circuit substrates allotted for receiving connectors.

The drive for miniaturization has also been accompanied by a shift in preference to surface mount techniques (SMT) for mounting components on circuit boards. The confluence of the increasing use of SMT and the required fine pitch of linear connectors has resulted in approaching the limits of SMT for high volume, low cost operations. Reducing the pitch of the terminals increases the risk of bridging adjacent solder pads or terminals during reflow of solder paste. To satisfy the need for increased I/O density, array connectors have been proposed. Such connectors have a two dimensional array of terminals mounted on an insulative substrate and can provide increased density. However, these connectors present certain difficulties with respect to attachment to the circuit substrate by SMT techniques because the surface mount tails of most, if not all, of the terminals must be beneath the connector body. As a result, the mounting techniques used must be highly reliable because it is difficult to visually inspect the solder connections to repair them if faulty.

In the mounting of an integrated circuit (IC) on a plastic or ceramic substrate, the use of a ball grid array (BGA) and other similar packages has become common. In a BGA package, spherical solder balls attached to the IC package are positioned on electrical contact pads of a circuit substrate to which a layer of solder paste has been applied, typically by use of a screen or mask. The unit is then heated to a temperature at which the solder paste and at least a portion or all of the solder ball melt and fuse to an underlying conductive pad formed on the circuit substrate. The IC is thereby connected to the substrate without need of external leads on the IC.

While the use of BGA and similar systems in connecting an IC to a substrate has many advantages, a corresponding means for mounting an electrical connector or similar component on a printed wiring board (PWB) or other substrate has yet to be developed. It is important for most situations that the substrate-engaging surfaces of the solder balls are coplanar to form a substantially flat mounting interface, so that in the final application the balls will reflow and solder evenly to a planar printed circuit board substrate. Any significant differences in solder coplanarity on a given substrate can cause poor soldering performance when the connector is reflowed onto a printed circuit board.

Another problem presented in soldering connectors to a substrate is that connectors often have insulative housings that have relatively complex shapes, for example, ones having numerous cavities. Residual stresses in such housings can result from the molding process, from the buildup of stress as a result of contact insertion, or a combination of both. These housings may become warped or twisted either initially or upon heating to temperatures necessary in SMT processes, such as temperatures necessary to reflow the solder balls. Such warping or twisting of the housing can cause a mismatch between the connector assembly and the PWB, resulting in unreliable soldering because the surface mounting elements, such as solder balls, are not sufficiently in contact with the solder paste or close to the PWB prior to soldering.

One drawback of BGA packages is that the coefficient of thermal expansion (CTE) of the material used in the connector housing is very different from the CTE of the PWB. The different CTEs affects the performance and reliability of the electrical connections by causing stress on solder joints and wire bonds, thereby leading to deformation and warpage of the PWBs or IC chips and chip carriers that are to be connected to the package. The greater the differential displacements created by CTE mismatch during thermal changes, the greater concern for the electrical integrity of the system.

BGA packages are subjected to high temperatures during processing, testing and soldering. Accordingly, it is important that the package be able to withstand high temperature variations without inhibiting or degrading a reliable electrical connection. A need, therefore, exists for reliably and efficiently mounting high density electrical connectors on substrates by surface mounting techniques.

SUMMARY OF THE INVENTION

The present invention is directed to a connector for reducing the effects of the differential in the coefficient of thermal expansion of the connectors and the underlying circuit board. The connector in accordance with the present invention can be mounted on a known circuit board or the like and could receive an electrical component or a mating connector. The present invention preferably uses ball grid array (BGA) surface mount technology.

Electrical connectors according to the present invention provide high I/O density and reliable attachment to circuit substrates by SMT techniques. These connectors exhibit high coplanarity along the mounting interface. Coplanarity of the surface mounting interface of the connector is maintained by providing an insulative connector housing in which stress buildup is avoided. The present invention accommodates the deformation or warpage caused by thermal cycling that would otherwise cause the stress buildup. The connector avoids stress buildup by providing a connector housing that incorporates compliant sections corresponding to the areas where the greatest deformation in the connector is expected. According to this aspect of the invention, the housing has notches or slots at locations furthest from the neutral point (NP) of the connector (i.e., around the corners). By means of this arrangement, stress buildup is avoided, so as to minimize warping and twisting of the housing.

Electrical connectors of the present invention are ones in which one or more terminals are connectable by a fusible electrically conductive material to a substrate. This fusible electrically conductive material is a solder mass, preferably comprising a solder ball that can be reflowed to provide the primary electrical current path between the terminal and a circuit substrate.

The foregoing and other aspects of the present invention will become apparent from the following detailed description of the invention when considered in conjunction with the accompanying drawings.

DESCRIPTION OF EXEMPLARY EMBODIMENTS AND BEST MODE

Generally, the present invention provides an electrical connector preferably surface mounted to a circuit substrate using, as one example, ball grid array (BGA) technology. In accordance with the present invention, the housing of the connector has slots or other shaped features at selected locations on the housing to prevent warpage when mounted or laminated to a substrate such as a PWB, PCB, or semiconductor chip.

Figure 1:
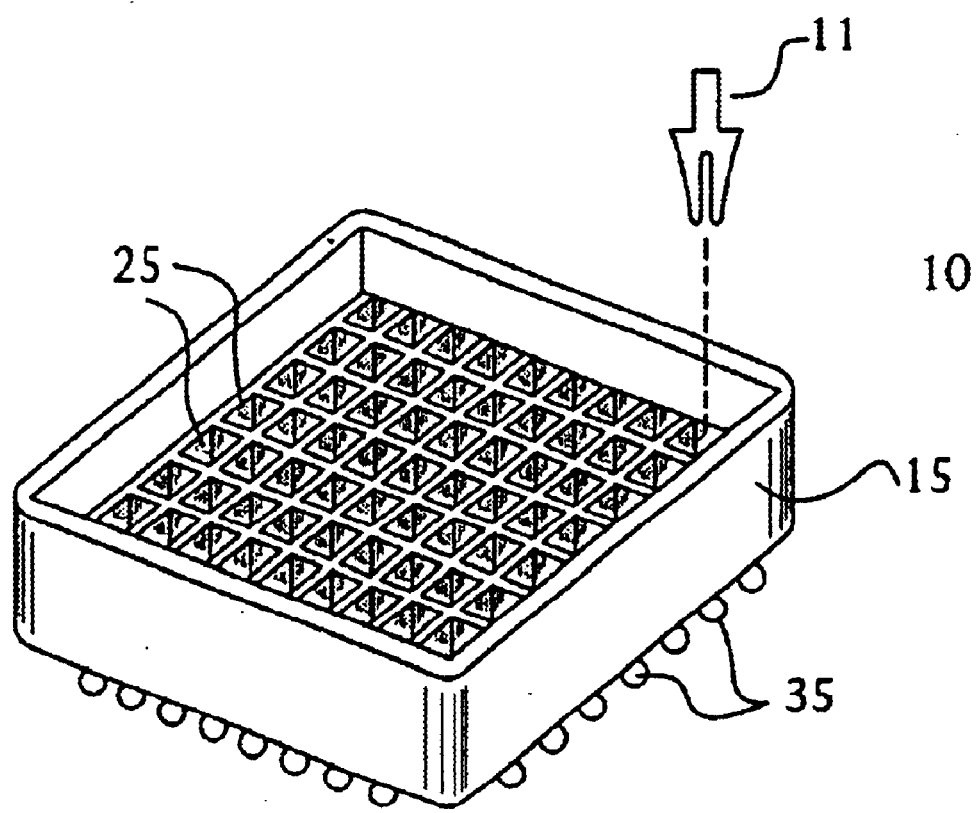
FIG. 1 is a top perspective view of the conventional BGA interface connector.
Figure 2:
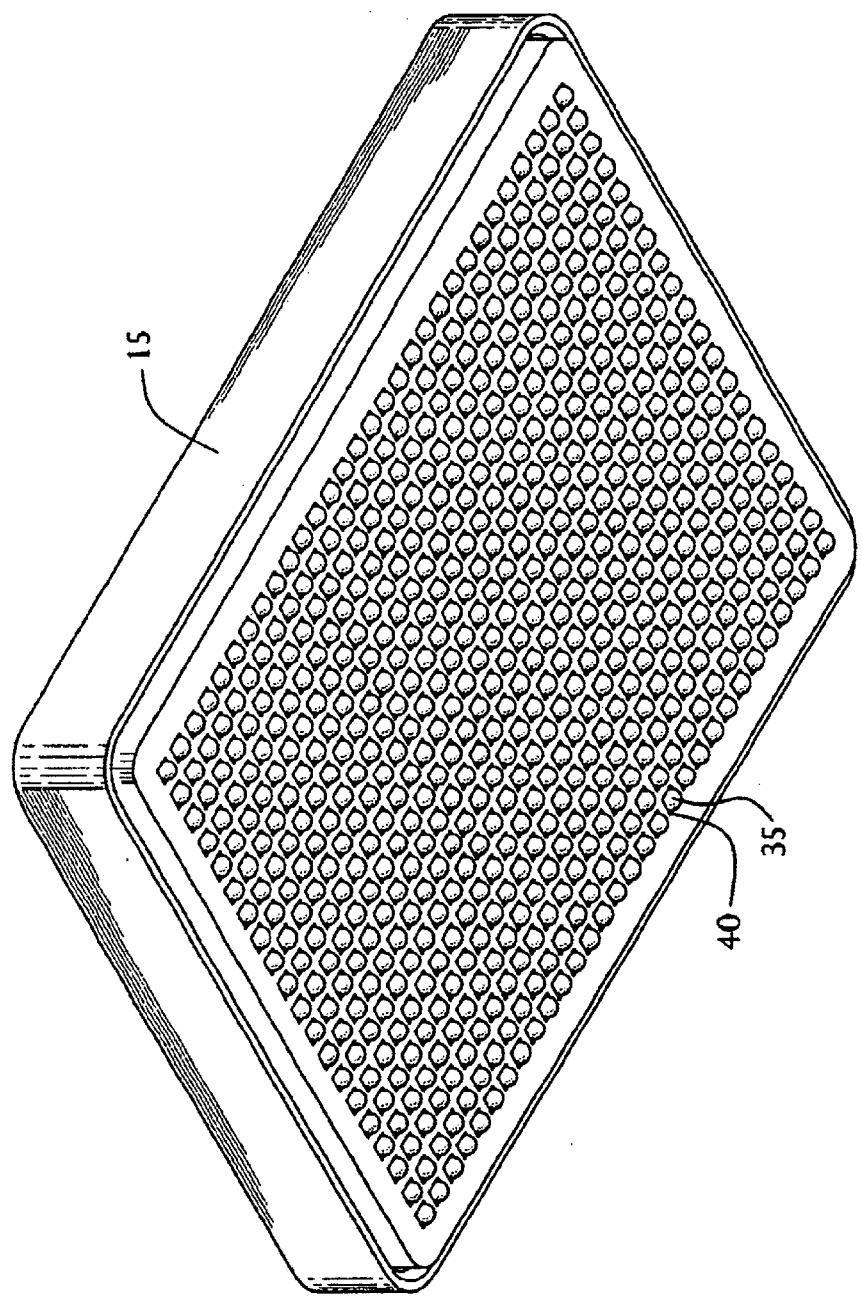
FIG. 2 is a bottom perspective view of the BGA interface connector of FIG. 1.

A perspective view of a conventional interface connector, such as a BGA connector, is shown in FIG. 1. FIG. 2 is a bottom perspective view of the exemplary interface connector. The BGA package 10 comprises a housing 15 made from a suitable dielectric material. A plurality of contacts 11 extend through the housing with one end adjacent a lower surface of the substrate. The contacts comprise an electrically conductive material such as a copper alloy. A fusible element 35, such as a solder ball, is fused to a surface of the contact and at least partially within an aperture 40 on the bottom of housing 15. Conductive solder balls 35 are metallurgically wetted to contacts during a reflow process. More particularly, flux is applied to the contacts and/or the aperture 40. The spherical solder balls 35 are then placed in the paste temporarily. The assembly is then inserted into a reflow furnace (not shown) and heated. This causes the balls 35 and solder paste to wet and melt onto the surfaces of their respective contacts and to assume a generally spherical shape. Conductive solder balls 35 are spaced a pitch apart, which can be on the order of 1.0 to 1.8 mm. International Publication number WO 98/15989 (International Application number PCT/US97/18056), herein incorporated by reference, describes in further detail the methods of securing a solder ball to a contact and/or a circuit substrate. The contacts form a series of rows and columns on the housing of the connector. The solder balls, when fused to the contacts, preferably all have the same elevation. This ensures a proper connection to an underlying printed wiring board (PWB).

Any balls formed of solder that flows completely, i.e., melts completely and then resolidifies, or that even partially reflows, can be used. Examples are tin bismuths, 63-37 eutectic, and other newer solders which reflow at temperatures in the range of 183° C. The solder reflow processes used herein generally heat the solder balls 35 up to 225° C. to 240° C.

The conductive solder balls 35 are connected to an underlying assembly or PWB using either the same solder reflow process that fuses the solder balls 35 to the contacts, or a subsequent reflow step. The PWB has a plurality of contact pads arranged in a pattern. Conductive solder balls 35 connect to the contact pads to form solder joints. After the mounting process, solder joints take a flattened spherical shape defined by solder volume and wetting areas. The number and arrangement of conductive solder balls 35 on the lower surface of substrate depends on circuit requirements including input/output (I/O), power and ground connections.

More particularly, the BGA assembly 10 is connected to a previously-manufactured circuit board which has an array of conductive pads on it. Solder paste is screened (using a stencil and squeegee) onto the circuit board pads. A placement machine (not shown) places the assembly 10 onto the tops of the solder paste, and the resulting construction is heated in a reflow furnace (also not shown). The balls 35 then reflow onto the circuit board pads.

The housing comprises a plurality of passageways 25 into which the contacts can be inserted. The passageways 25 preferably frictionally retain the contacts in the housing until reflow. In this manner, the contacts will be electrically connected to the underlying PWB that the BGA package is ultimately connected to using the BGA mounting technology. Thus, the connector provides, for example, a board-to-board interconnection.

The connector 10 could have a wall disposed around the periphery of the connector to help guide a mating connector (not shown). The wall can include suitable keying features (not shown) to ensure proper mating with the mating component.

The difference in the coefficient of thermal expansion (CTE) of the substrates, such as the PWBs, and the connector 10, and the coplanarity of the fusible elements 35 are two important considerations with large scale array connectors. CTE differential can introduce stress into the solder joints that couple the connector 10 and the PWB or substrate. Solder joint stress potentially reduces the thermal reliability of the connector 10. CTE differential can also warp the connector 10. Connector warp potentially misaligns the mating connectors, which increases the required peak insertion force. Connector warp may also affect the coplanarity of the fusible elements 35 that couple the connector to the substrate.

In accordance with the present invention, locations at the greatest distance from the neutral point (NP) of the connector are conditioned to allow the areas to flex so as to absorb stresses that could damage the solder joint. In other words, the housing is not as strong and bends easier. This reduces solder joint stress, thereby accommodating warp. Typically, the corners of housing 15 comprise the greatest distance to neutral point (DNP). The conditioning can involve notching areas of the housing.

Figure 3:
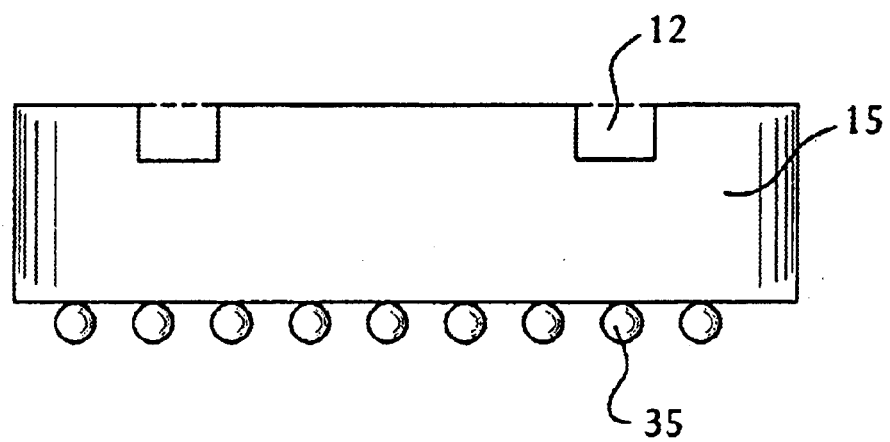
FIG. 3 is a side view of an exemplary BGA interface connector in accordance with the present invention.
Figure 4:
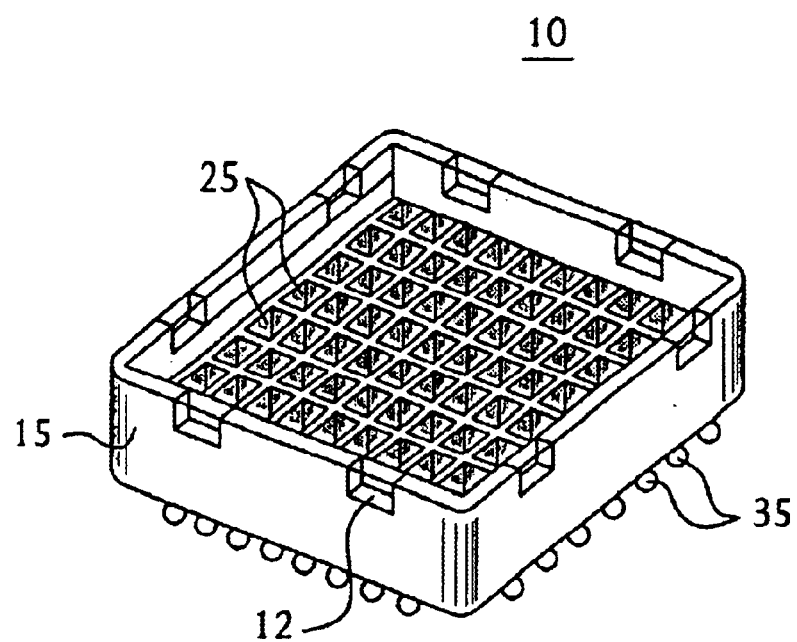
FIG. 4 is a perspective view of the BGA interface connector of FIG. 3.
Figure 5:
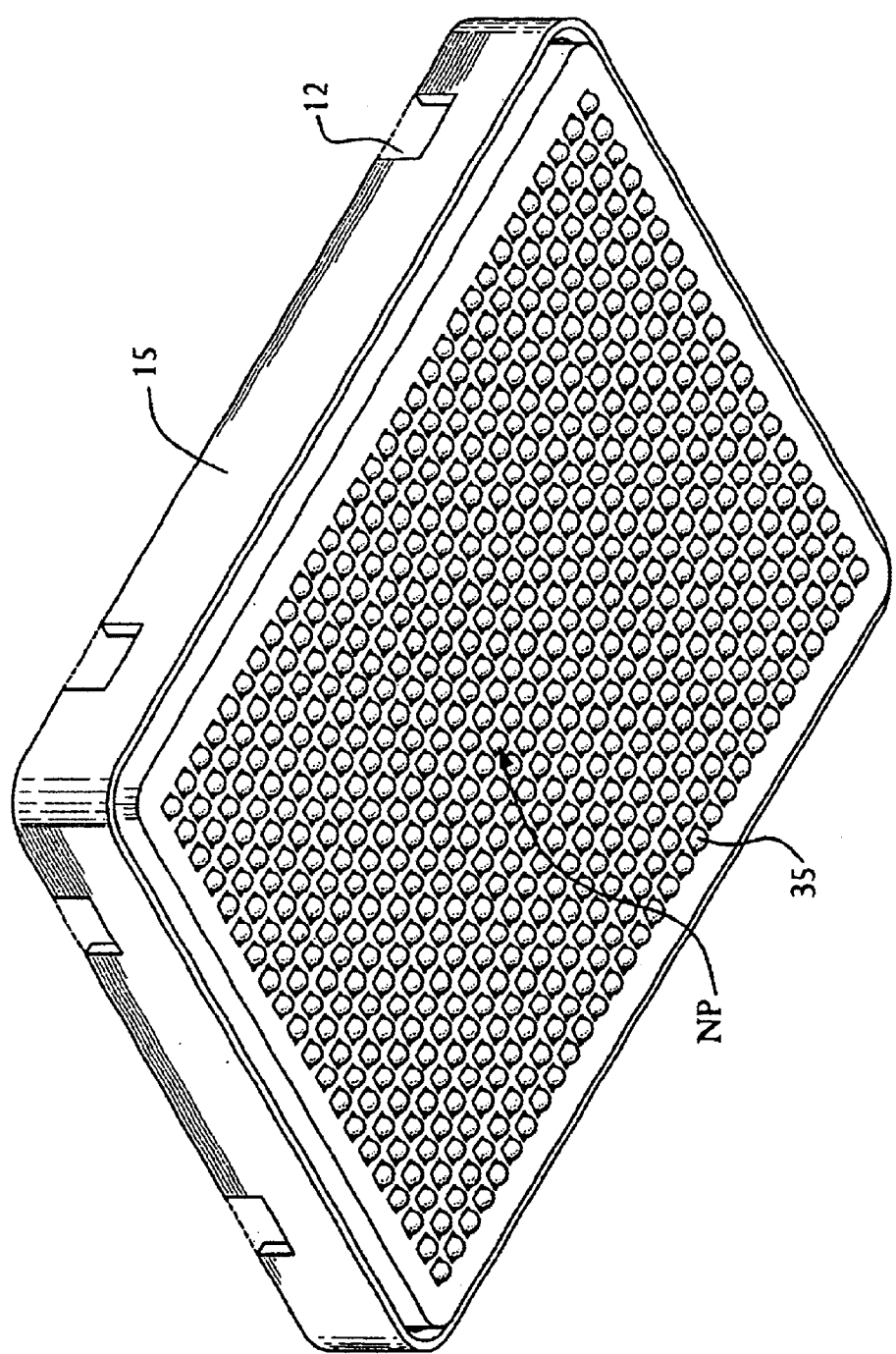
FIG. 5 is a bottom perspective view of the BGA interface connector of FIG. 3.

FIG. 3 is a side view of an exemplary BGA interface connector in accordance with the present invention, FIG. 4 is a perspective view of the BGA interface connector of FIG. 3, and FIG. 5 is a bottom perspective view of the BGA interface connector of FIG. 3. The housing 15 has openings 12 in sidewalls that are placed at desired locations so as to allow the housing 15 to be compliant along desired axes (typically perpendicular to the plane of the circuit substrate). As a result, a reduction in solder joint stress between the connector 10 and its mounting substrate (such as an underlying PWB) results. Thus, during thermal cycling, the effects of the differential in the coefficient of thermal expansion of the PWB substrate and the connector 10 are minimized.

Moreover, the coplanarity of the contacts is improved. Since the areas of housing 15 near openings 12 tend to flex, preferably no contacts are placed in housing 15 adjacent these locations.

It should be noted that the disruption the material in the frame of the housing 15 can be any shape, and positioned anywhere on the frame, in order to give the desired effects.

The present invention addresses the effects of CTE mismatch by providing slots or notches in the connector housing. Thus, the present invention solves a reliability failure mechanism, CTE mismatch.

Although the present invention has been described with respect to BGAs, other packages, such as $\mu$BGA and other chip scale grid array (CSGA) type packages, flip chip, and C4 type connections can also be used with the present invention.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed is:

1. An electrical connector, comprising:
    a housing including a peripheral wall surrounding and rising above an array of contact receiving passageways and having a perimeter edge;
    a plurality of separate surface mount contacts for connecting said housing to a substrate by a reflow process employing heat; and
    areas of reduced rigidity in portions of said peripheral wall of the housing at which stress builds up due to the heat of the reflow process, each of the areas of reduced rigidity comprising portions of removed housing extending substantially perpendicular to a surface of the housing and extending through a distal end of said peripheral wall of the housing from an inner face to an outer face of the peripheral wall;
    such that said areas of reduced rigidity contribute to said plurality of separate surface mount contacts better retaining their co-planarity during and after the reflow process.

2. The electrical connector according to claim 1, wherein the areas of reduced rigidity in the housing are located at positions furthest from a neutral point of the connector.

3. The electrical connector according to claim 1, wherein each of the areas of reduced rigidity comprises one of a notch and a slot.

4. The electrical connector according to claim 1, wherein the areas of reduced rigidity are disposed to absorb stress and accommodate warp.

5. The electrical connector according to claim 1, wherein the housing is made from a dielectric material.

6. The electrical connector according to claim 1, wherein the plurality of separate surface mount contacts comprise solder balls.

7. A method of reducing rigidity in a housing of an electrical connector having a plurality of separate surface mount contacts, comprising:
    determining a location on said housing which may build up stress during a reflow process employing heat in which the plurality of separate surface mount contacts connect said housing to a substrate; and
    removing a portion of the housing extending substantially perpendicular to a surface of the housing at said location.

8. The method according to claim 7, wherein said location is generally furthest from a neutral point of the connector.

9. The method according to claim 7, wherein said location is located to absorb stress and accommodate warp.

10. The method according to claim 7, wherein the portion is one of a slot and a notch.

* * * * *